(12) United States Patent
Chang et al.

(10) Patent No.: US 9,347,997 B2
(45) Date of Patent: May 24, 2016

(54) STATE OF CHARGE DETERMINATION SYSTEMS AND METHODS

(75) Inventors: Chun-Chieh Chang, Ithaca, NY (US); Tsun Yu Chang, Taichung (TW)

(73) Assignee: CHANGS ASCENDING ENTERPRISE CO., LTD., Situn District, Taichung (TW)

( * ) Notice: Subject to any disclaimer, the term of this patent is extended or adjusted under 35 U.S.C. 154(b) by 1293 days.

(21) Appl. No.: 13/073,060

(22) Filed: Mar. 28, 2011

(65) Prior Publication Data
US 2012/0249086 A1    Oct. 4, 2012

(51) Int. Cl.
- *H02J 7/00* (2006.01)
- *G01R 31/36* (2006.01)
- *G01R 19/00* (2006.01)

(52) U.S. Cl.
CPC ................................. *G01R 31/3624* (2013.01)

(58) Field of Classification Search
CPC .............................. H02J 7/00; G01R 31/3624
USPC ...................................... 320/132; 702/63, 64
See application file for complete search history.

(56) References Cited

U.S. PATENT DOCUMENTS

| | | | |
|---|---|---|---|
| 4,937,528 A * | 6/1990 | Palanisamy | 324/430 |
| 5,898,291 A | 4/1999 | Hall | |
| 5,907,238 A | 5/1999 | Owerko | |
| 5,929,609 A | 7/1999 | Joy | |
| 6,060,864 A | 5/2000 | Ito et al. | |
| 6,064,178 A | 5/2000 | Miller | |
| 6,252,377 B1 | 6/2001 | Shibutani et al. | |
| 6,271,645 B1 | 8/2001 | Schneider et al. | |
| 6,291,972 B1 | 9/2001 | Zhang | |
| 6,461,764 B1 | 10/2002 | Nakamura | |
| 6,465,986 B1 | 10/2002 | Haba | |
| 6,511,764 B1 | 1/2003 | Marten | |
| 6,586,909 B1 | 7/2003 | Trepka | |
| 6,642,693 B2 | 11/2003 | Anzawa et al. | |
| 6,700,350 B2 | 3/2004 | Formenti et al. | |
| 6,777,908 B2 | 8/2004 | Thorne et al. | |
| 6,784,638 B2 | 8/2004 | Yang | |
| 6,801,014 B1 | 10/2004 | Chitsazan | |
| 6,825,638 B2 | 11/2004 | Kim | |
| 6,841,971 B1 | 1/2005 | Spee et al. | |
| 6,873,134 B2 | 3/2005 | Canter et al. | |
| 6,882,129 B2 | 4/2005 | Boskovitch et al. | |
| 7,061,207 B2 | 6/2006 | Patel et al. | |
| 7,068,011 B2 | 6/2006 | Yang | |

(Continued)

FOREIGN PATENT DOCUMENTS

| | | |
|---|---|---|
| EP | 0600234 A2 | 10/1993 |
| EP | 1220413 A1 | 9/2000 |

OTHER PUBLICATIONS

International Search Report and Written Opinion, mailed Jun. 19, 2012.

(Continued)

*Primary Examiner* — Richard V Muralidar
(74) *Attorney, Agent, or Firm* — Thomas | Horstemeyer, LLP

(57) ABSTRACT

In one embodiment, a method implemented by a processor, comprising receiving voltage values corresponding to a battery system, receiving charge values corresponding to charge flowing through the battery system, and determining a state of charge based on specified anchoring points of a charge integration, the anchoring points based on the received voltage and time.

17 Claims, 4 Drawing Sheets

(56) References Cited

U.S. PATENT DOCUMENTS

| | | |
|---|---|---|
| 7,508,166 B2 | 3/2009 | Ishikawa et al. |
| 7,598,706 B2 | 10/2009 | Koski et al. |
| 7,777,451 B2 | 8/2010 | Chang et al. |
| 7,782,013 B2 | 8/2010 | Chang |
| 7,808,207 B1 | 10/2010 | Chang |
| 7,821,231 B1 | 10/2010 | Chang et al. |
| 7,825,632 B1 | 11/2010 | Chang |
| 2004/0209161 A1 | 10/2004 | Dubac et al. |
| 2005/0029986 A1 | 2/2005 | Morgan |
| 2006/0186859 A1 | 8/2006 | Fujikawa et al. |
| 2008/0208494 A1 | 8/2008 | Holz |
| 2010/0253278 A1 | 10/2010 | Chang et al. |

OTHER PUBLICATIONS

European Search Report for EP 12 76 2898 mailed May 8, 2015.

* cited by examiner

US 9,347,997 B2

STATE OF CHARGE DETERMINATION SYSTEMS AND METHODS

TECHNICAL FIELD

The present disclosure is generally concerned with probing the state of charge of a battery system.

BACKGROUND

Battery systems (e.g., including one or more batteries) are becoming more and more important in everyday life since the spectrum of applications have been widely broadened, ranging from portable devices such as cell phones to heavier duty applications such as fork lifts, golf carts, and even electric or hybrid electric vehicles in recent years. In any of the applications mentioned above (or other applications), reliable state of charge monitoring is important in enabling battery systems to be commercially viable. In some cases, such as electric and hybrid vehicles, the state of charge monitoring may even be related to safety issues.

SUMMARY

In one embodiment, a method implemented by a processor, comprising receiving voltage values corresponding to a battery system, receiving charge values corresponding to charge flowing through the battery system, and determining a state of charge based on specified anchoring points of a charge integration, the anchoring points based on the received voltage and time.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of certain embodiments of the present disclosure. Moreover, in the drawings, like reference numerals designate corresponding parts throughout the several views.

DETAILED DESCRIPTION

Figure 1:
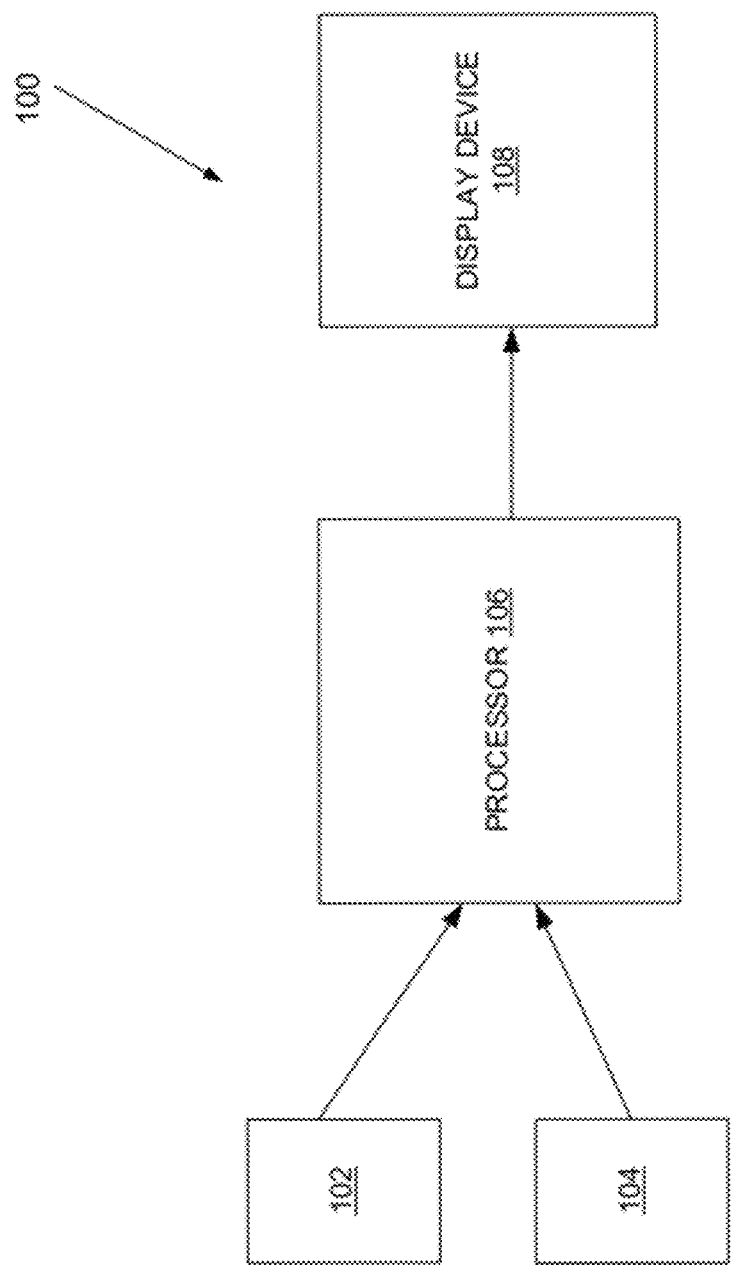
FIG. 1 is a block diagram that illustrates an embodiment of an example state of charge determination system.

Disclosed herein are certain embodiments of state of charge determination systems and methods, collectively and individually referred to herein as state of charge determination systems or SCD systems. One or more embodiments of SCD systems provide an accurate, efficient, economic, and reliable system that may be used in probing a state of charge (e.g., available capacity) of a battery system (e.g., a battery or plural batteries). For instance, in one embodiment, the state of charge of a battery system is determined through tacit implementation of voltage detection and charge integration.

Digressing briefly, the state of charge of a battery system may conventionally be probed solely based on voltage. However, probing the voltage of the battery system alone may be misleading and/or unreliable when the battery system is operated under high current input/output conditions that may cause unpredictable voltage increases or drops during charging or discharging processes. Further, conventional voltage probing techniques may be inaccurate for other reasons, such as when the voltage plateau of the battery system is too flat relative to capacity. This latter condition is especially true for lithium iron phosphorous oxide-based batteries or lithium iron phosphate-based lithium ion based batteries that possess a flat voltage plateau over a wide range of capacity readings.

To overcome one or more of the problems mentioned above, among other problems, certain embodiments of SCD systems disclosed herein utilize charge integration to prevent inadequate capacity probing, such as in implementations where high power and flat plateau conditions are present. However, since charge integration alone may possess shortcomings in accuracy over time (e.g., caused by drift in readings and/or accuracy limitations of the charge integrator), certain embodiments of SCD systems combine charge integration with voltage detection.

For clarity, use of the term "battery" herein refers to a single electrochemical cell and use of the phrase "battery system" refers to a cell or a plurality of cells connected in series and/or in parallel fashion. In other words, a battery system may comprise a single battery.

It is known that a typical discharge profile for a battery system comprises a voltage that changes with time. Further, it is known that the discharge profile may be different when the battery system is discharged under a different current magnitude. As a result, charge integration may be used in determining the state of charge more reliably than voltage alone, the use of voltage alone conventionally used for monitoring the battery state of charge. Since charge integration requires start and end points for integration, certain conditions may determine the integration start and end points (referred to herein as anchoring points). In the present disclosure, voltage and time, or voltage, current, and time may be used in determining the anchoring points. Between anchoring points, charge integration may be meaningful in determining the state of charge of a battery system.

FIG. 1 is a block diagram that illustrates an embodiment of an example state of charge determination (SCD) system 100. The SCD system 100 comprises battery voltage sense logic 102 and shunt voltage sense logic 104. The battery voltage sense logic 102 and shunt voltage sense logic 104 are configured to sense battery voltage and the shunt resistance voltage drop, respectively. It should be understood by one having ordinary skill in the art in the context of the present disclosure that shunt voltage sense logic 104 may be embodied as any device used for measuring current directly (e.g., a Hall ring). Similarly, one having ordinary skill in the art should understand that a plurality of different circuitry, well known in the art, may be used for the battery voltage sensing.

The SCD system 100 further comprises a processor 106 configured to receive one or more inputs (e.g., values) from the battery voltage sense logic 102 and shunt voltage sense logic 104. Such inputs may include voltage values, current values, and/or charge values, among other data. The processor 106 may comprise a microprocessor, microcontroller, or function-specific integrated circuit. The processor 106 is configured by embedded code (or in some embodiments, via retrieval of software or firmware from a coupled volatile and/or non-volatile storage device, such as memory) to provide time count (e.g., alone or in combination with a hardware and/or software clocking circuit), charge integration (e.g., for state of charge determinations), current magnitude calculations (e.g., via dividing integrated charge with time), and battery voltage determinations. In some embodiments, the processor 106 merely receives the voltage determinations and uses the same for further processing.

The processor 106 is further configured to provide, via a wireless or wired connection, output data to a display device 108. The output data includes, without limitation, state of charge readings, current magnitude readings, and battery voltage readings. The display device 108 may be located remotely or locally relative to the processor 106. The display device 108 comprises a display screen based on one of a plurality of known display technologies, such as liquid crystal diode (LCD) or light-emitting diode (LED) technologies.

Figure 2:
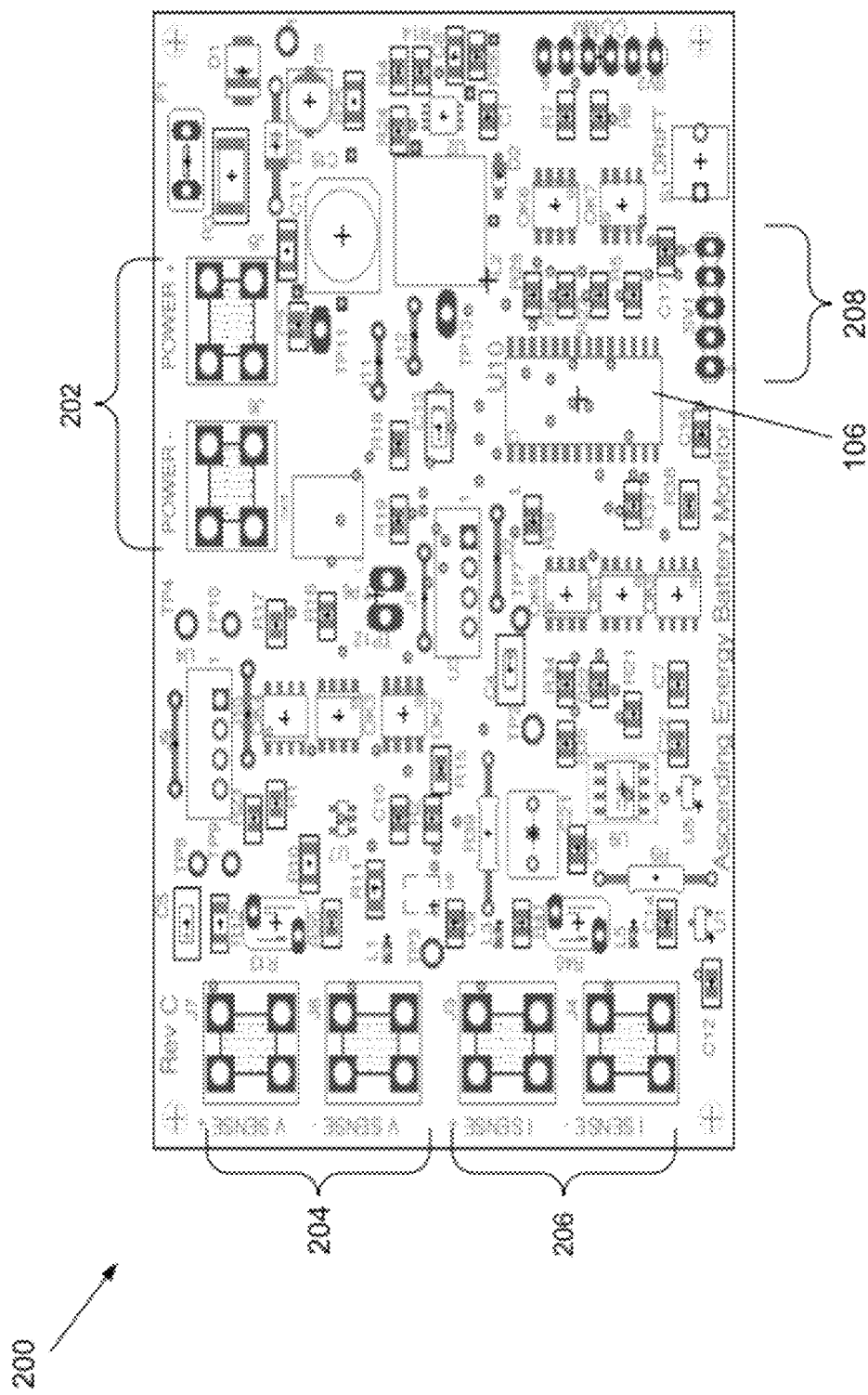
FIG. 2 is a schematic diagram that illustrates an embodiment of an example device configured to implement a state of charge determination method.

FIG. 2 is a schematic diagram that illustrates an embodiment of an example device configured to implement a state of charge determination method, and in general, state of charge monitoring. In particular, the device 200 comprises a state of charge board, including power source input terminals 202, battery voltage sense terminals 204, shunt voltage sense terminals 206, an output interface 208, and the processor 106. The power source input terminals 202 are configured to receive power from a power source, the power source driving the device 200. In some embodiments, a power source may be integrated with the device 200. The battery voltage sense terminals 204 and shunt voltage sense terminals 206 are configured to receive data from the battery voltage sense logic 102 and shunt voltage sense logic 104, respectively. In some embodiments, one or more probes may be used for the sensing and logic on the board associated with each of the terminals 204 and 206 provides for appropriate calculations, such as charge, voltage, current, etc.

In one embodiment, the data received at the battery voltage sense terminals 204 comprises voltage values used for determining (e.g., by the processor 106) the anchoring points. The shunt resistance voltage drop readings received at the shunt voltage sense terminals 206 are used (e.g., by the processor 106) for charge integration. The output interface 208 is configured to provide information (e.g., data) for display on a screen of the display device 108. In one embodiment, the processor 106 (or memory accessed by the processor 106 in some embodiments) is configured with a table or other data structure that is used in setting up parameters. For instance, the table may be populated with data, such as inputted voltage, time, and/or current for use in establishing anchoring points. The table may also allow for other inputted data, such as shunt resistance, initial battery capacity, and/or adjustments for drift correction time.

It should be understood by one having ordinary skill in the art, in the context of the present disclosure, that one embodiment of an SCD system may comprise the device 200, or a subset of components located therein (e.g., the processor 106). In some embodiments, the SCD system may comprise the components depicted in FIG. 1. Some embodiments of the SCD system may include a combination of components shown in FIGS. 1 and 2, and hence these and other variations are contemplated to be within the scope of the disclosure.

Having described some example SCD systems, attention is directed now to various methods of state of charge determinations. In the examples that follow, high and low state of charge determinations are described in the context of 100% state of charge and 0% state of charge, respectively, with the understanding that other values may be used for some embodiments. A high state of charge (e.g. 100%) condition determination corresponds to a high (e.g., 100%) anchoring point for the state of charge. In one embodiment, voltage and time are used for the high anchoring point determination. For example, if the cumulative voltage of sixteen (16), serially-arranged batteries of say, a lithium iron phosphorous oxide battery system, exceeds 56 volts (V) for a duration period of 20 seconds, a 100% state of charge is determined. Any further charging is not considered in the increase in capacity.

In some embodiments, the high anchoring point may be determined by the voltage, time, and current magnitude. For example, if the cumulative voltage of sixteen (16), serially-arranged batteries of say, a lithium iron phosphorous oxide battery system, exceeds 56V, and a charging current is less than 500 mA for a duration period of 20 seconds, a 100% state of charge is determined.

In one embodiment, two conditions corresponding to the high anchoring point are analyzed as follows:

Condition 1: If the charge integration has exceeded 100% before this anchoring point is reached, only a portion of (e.g., 99%) state of charge is displayed and the charge integration remains active. Explaining further, charge count is obtained from charge integration, and the charge count may commence at any number. As described above, a table may be used by the processor 106 to establish an initial battery capacity, which results in a relationship set-up between capacity and charge count (e.g., 100 counts for 1 Ah, which may correspond to, for instance, a 1% capacity). Since charge integration may cause the charge count to go to any number, the possibility exists that the charge count exceeds 100% state of charge (e.g., introduced by integration errors accumulated over time) before the anchoring point is reached. In this scenario, a maximum of 99% is displayed with charge integration remaining active. Note that displayed values may include current, voltage, and state of charge (e.g., in percent). Charge count may be used a reference, though not displayed.

Condition 2: If the charge integration has not exceeded 100% and the high anchoring point is reached, 100% state of charge is displayed. Under such conditions, a new reference point (charge count number) for charge integration is determined and kept at that number. This means that the specific charge count is set as 100% state of charge. Charge integration will be resumed only when battery voltage drops below a certain point (e.g., 55.5V in the present example) of the battery system, which means that the change of charge count happens (e.g., only) when battery system voltage drops below some defined voltage (e.g. 55.5V).

Note that in some embodiments, the high anchoring point may be specified by voltage, time, or voltage, time, current, or the repetition of aforementioned conditions for specified times (e.g. if voltage exceeds 56V, 0 second, for 3 times). Such embodiments address the possibility of charging the battery by controlling the charging end voltage only, which means the charger repeats charging between, say, 56.5V and some low voltage like 53V, and repetition is performed for specified hours or terminated by other means such as manually.

As mentioned above, the aforementioned conditions include using 100% as an illustrative example, with the understanding that the same or similar methodology using a different value (e.g., 90%) as the high anchoring point may be implemented in some embodiments. For example, 90% may be used as a characteristic bench mark for representing the true capacity of a battery that can be determined via the detection of voltage, current, and duration time.

In addition, the same or similar methodology may be applied using one or several high anchoring points (e.g., simultaneously) for state of charge monitoring.

Having described an example high state of charge, attention is now directed to methods involved in low (e.g., 0%) state of charge condition determinations corresponding to a low anchoring point (e.g., 0%) for the state of charge. In one embodiment, voltage and time are used for the low anchoring point determination. For example, if the cumulative voltage of sixteen (16), serially-arranged batteries of say, a lithium iron phosphorous oxide battery system, goes below 40V for a duration period of 20 seconds, a 0% state of charge is determined.

In some embodiments, the low anchoring point may be determined by the voltage, time, and current magnitude. For example, if the cumulative voltage of sixteen (16), serially-arranged batteries of say, a lithium iron phosphorous oxide battery system, goes below 40V, and a discharging current is less than 500 mA for a duration period of 20 seconds, a 0% state of charge is determined. The significance in specifying the current magnitude is, for example, for the prevention of triggering the low anchoring point erroneously when the battery system is discharged under a high current condition that leads to high drop in voltage. Similar to the approach described above, two conditions corresponding to the low anchoring point are analyzed as follows:

Condition 1: If the charge integration decreases below 0% before the low anchoring point is reached, only 0% state of charge is displayed and the charge integration is kept active. For instance, one example scenario includes the situation where the battery system is discharged before the low anchoring point is triggered. The charge integration proceeds normally but the 0% state of charge is an indication that is presented (displayed) as the minimum state of charge.

Condition 2: If the charge integration does not decrease below 0% and the low anchoring point is reached already, then 0% state of charge is displayed. Under such conditions, the charge integration is kept active and the charge integration and display relationship is re-established based on a consideration that the previous state of charge has been adjusted to zero (0).

The conditions analyzed above with reference to the low anchoring point use 0% as an illustrative example, with the understanding that the same or similar methodology may use another value (e.g., 10%) as the low anchoring point. For example, 10% can be used as a characteristic bench mark for representing the true capacity of a battery that can be determined via the detection of voltage, current, and duration time.

Additionally, the same or similar methodology may be applied for one or a plurality of low anchoring points, present simultaneously, for state of charge monitoring.

Certain embodiments of SCD systems may be configured to perform battery system capacity estimation and updates. For instance, such functionality may be used for updating the capacity of the battery system when the capacity is faded as cycle count progresses. The capacity update may be conducted (e.g., by the processor 106) by measuring the charge integration between two anchoring points. The processor 106 may specify (or adhere to) conditions for capacity update as if the charge integration between two anchoring points happens within certain period of time (e.g., for the prevention of capacity update with enormous charge integration error over time). In some embodiments, conditions for charge updates may occur if anchoring points are triggered below a defined discharge current magnitude (e.g., for the prevention of an erroneous capacity update when large continuous discharge current is present).

A non-exhaustive summary of typical example conditions that the processor 106 may set for triggering the capacity update includes the following: (a) when a high anchoring point is achieved; (b) when a low anchoring point is achieved within a certain current magnitude; and/or (c) when the time duration between the high and low anchoring points are triggered within a certain (e.g., defined) period of time. The conditions set for capacity updates are not limited to the example described above. For instance, any conditions that may be specified by voltage, time, time duration, current magnitude, and/or current direction (charging or discharging conditions) may be used for triggering battery system capacity updates depending on the application requirements.

As explained above, certain embodiments of a SCD system may include a state of charge monitoring board that detects voltage of a battery system and charge flowing through the battery system. Board outputs may include the voltage of the battery system, the current magnitude (e.g., via calculation by dividing charge with time), and the state of charge determined by anchoring points specified by voltage and time in one embodiment, or by voltage, current, and time in some embodiments. In some embodiments, the SCD system comprises the aforementioned state of charge board that further contains function of battery system capacity updates.

Further, certain embodiments of SCD systems comprise anchoring points that are specified by voltage and time, or in some embodiments, by voltage, current, and time, and are directly assigned to a specific state of charge. The anchoring points may be used in updating the capacity of the battery system by, for instance, comparing a charge count logged in when the anchoring points are detected. Aside from the anchoring points set for a specific state of charge, the state of charge may be determined by comparing the integrated charge change and an updated capacity (e.g., the most recent) of the battery system. The battery system capacity updates may be triggered during a charging process or a discharging process. Further, the battery system capacity updates may be triggered with further constraints of time duration between when the anchoring points are reached. The battery system capacity updates may be further limited by specifying the current magnitude range when anchoring points are reached.

Figure 3:
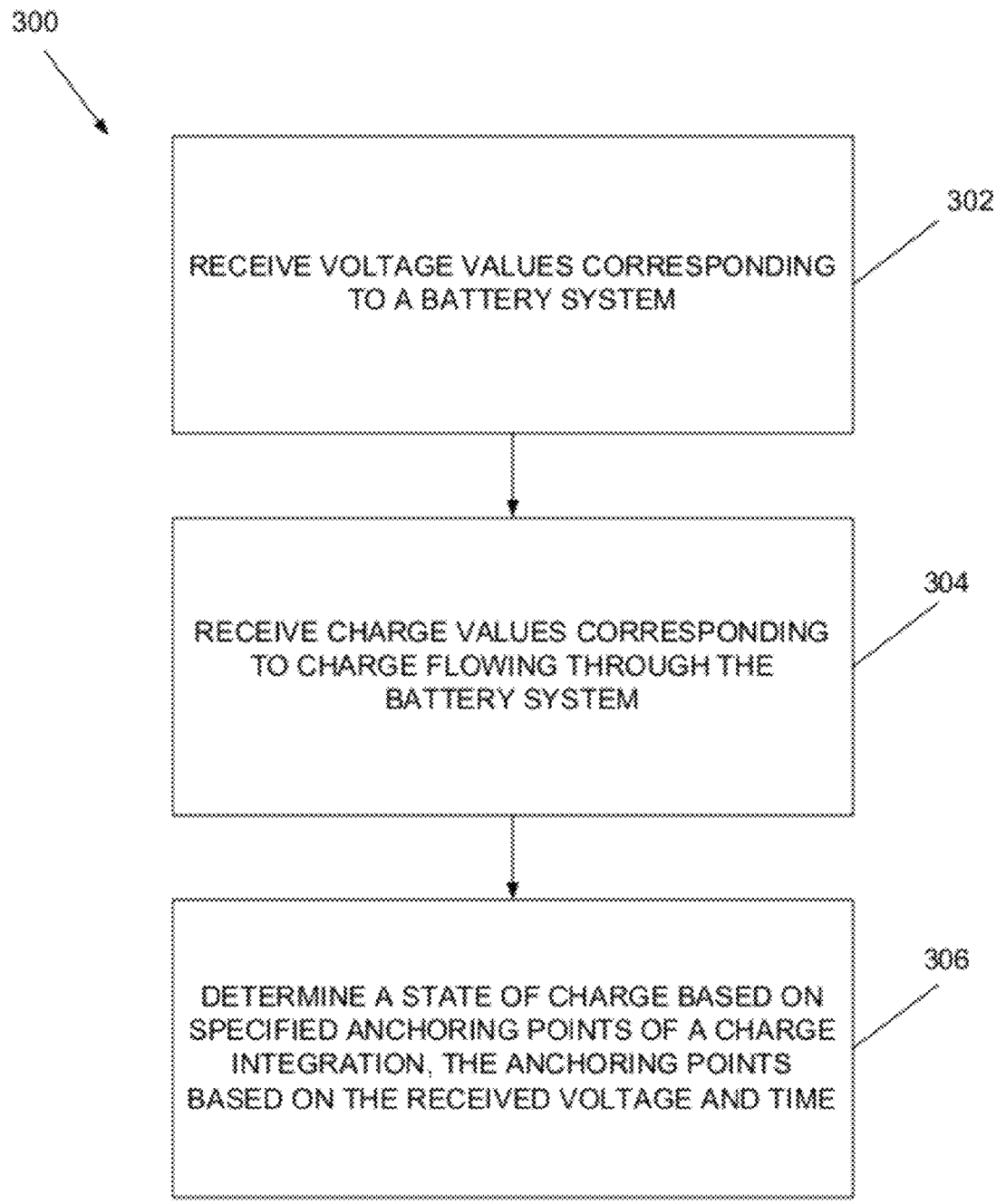
FIG. 3 is a flow diagram that illustrates an embodiment of a state of charge determination method.

Having described certain embodiments of the SCD system and associated methods, one method embodiment (e.g., as implemented by the processor 106 or board 200) shown in FIG. 3, having reference numeral 300, comprises receiving voltage values corresponding to a battery system (302); receiving charge values corresponding to charge flowing through the battery system (304); and determining a state of charge based on specified anchoring points of a charge integration, the anchoring points based on the received voltage and time (306).

Figure 4:
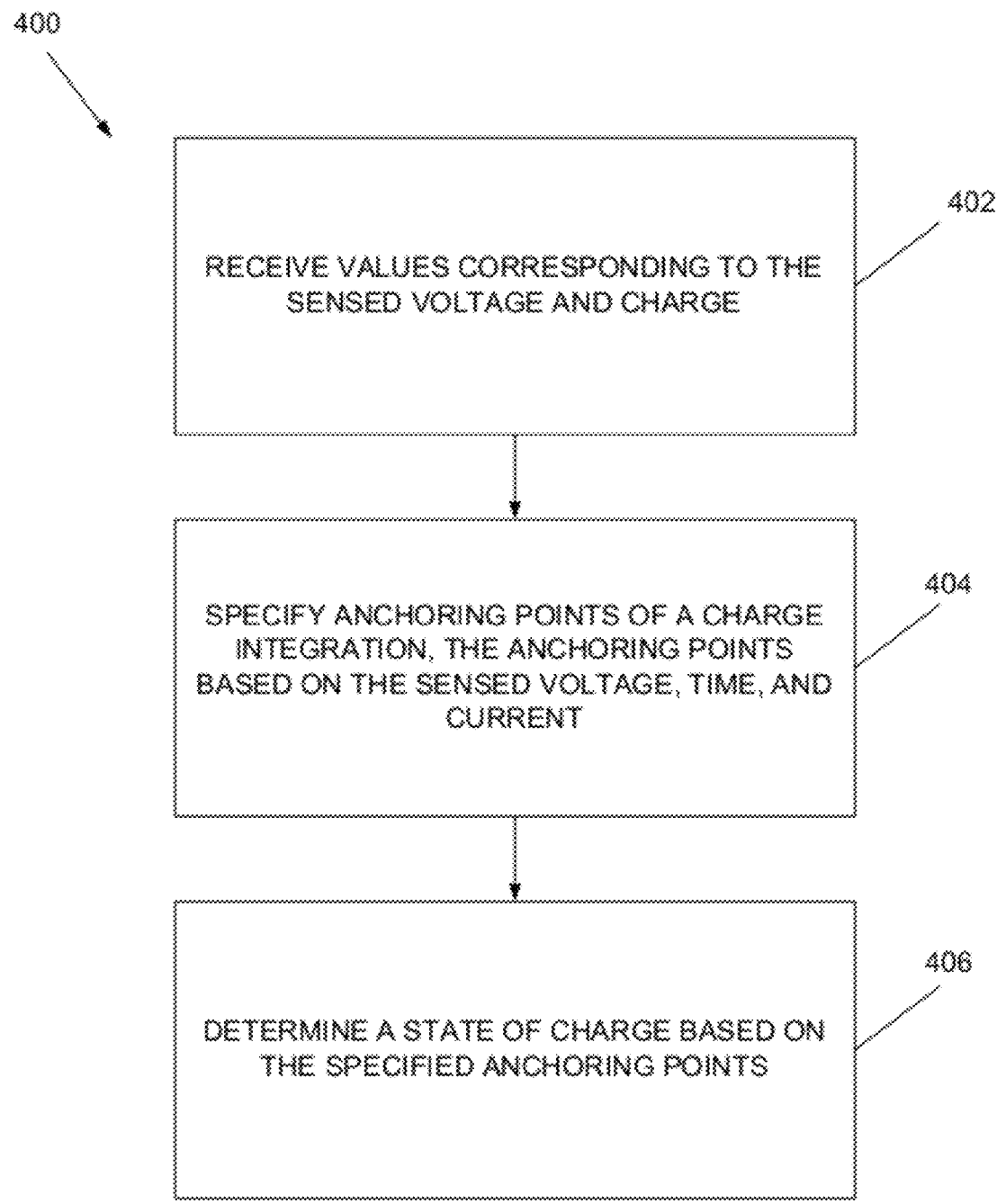
FIG. 4 is a flow diagram that illustrates another embodiment of a state of charge determination method.

Another method embodiment, having reference numeral 400 (e.g., as implemented by the processor 106 or board 200) and illustrated in FIG. 4, comprises receiving values corresponding to the sensed voltage and charge (402); specifying anchoring points of a charge integration, the anchoring points based on the sensed voltage, time, and current (404); and determining a state of charge based on the specified anchoring points (406).

The SCD system (or a subset of components thereof) may be implemented in hardware, software, firmware, or a combination thereof. When the SCD system is implemented in whole or in part in software or firmware, such software or firmware is stored in a non-transitory memory and is executed by a suitable instruction execution system. When the SCD system is implemented in whole or in part in hardware, the hardware may include any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Any process descriptions or blocks in flow diagrams should be understood as representing modules, segments, or portions of code which include one or more executable instructions for implementing specific logical functions or steps in the process, and alternate implementations are included within the scope of the disclosure in which functions may be executed out of order from that shown or discussed, including substantially concurrently or in reverse order, depending on the functionality involved, as would be understood by those reasonably skilled in the art of the present disclosure.

Other systems, methods, features, and advantages of the present disclosure will be or become apparent to one with skill in the art upon examination of the following drawings and detailed description. It is intended that all such additional systems, methods, features, and advantages be included within this description, be within the scope of the present invention, and be protected by the accompanying claims.

At least the following is claimed:

1. A method, comprising:
   receiving, by a processor, voltage values corresponding to a battery system;
   receiving, by the processor, charge values corresponding to charge flowing through the battery system;
   analyzing, by the processor, at least the received voltage values over at least one defined duration period of time;
   determining, by the processor, anchoring points of charge integration that satisfy respective defined conditions for respective defined duration periods of time by a defined quantity of repetition of conditions based at least in part on the received voltage and time, wherein the defined quantity of repetition is greater than 1;
   updating, by the processor, a capacity of the battery system by assigning the determined anchoring points that satisfy the respective defined conditions as updated anchoring points of the charge integration thereby replacing values of previously assigned anchoring points; and
   determining, by the processor, a state of charge based on the updated anchoring points of the charge integration.

2. The method of claim 1, wherein the determined anchoring points are further based on current flowing through the battery system, the current determined based on the charge and the time.

3. The method of claim 1, wherein the updating of the capacity of the battery system is further based on the charge integration between two of the updated anchoring points.

4. The method of claim 3, wherein determining the state of charge further comprises comparing an integrated charge change and the updated capacity.

5. The method of claim 1, further comprising triggering the updating during a charging process corresponding to the battery system.

6. The method of claim 1, further comprising triggering the updating during a discharging process corresponding to the battery system.

7. The method of claim 1, further comprising triggering the updating based on a defined period of time between anchoring points in which the charge integration occurs.

8. The method of claim 1, further comprising triggering the updating based on a magnitude of current attained when at least one of a pair of anchoring points of the charge integration is reached.

9. The method of claim 1, further comprising triggering the updating based on when one of a pair of anchoring points of the charge integration is reached.

10. The method of claim 1, wherein the updated anchoring points are determined by the defined quantity of repetition of conditions based on voltage, time, and current.

11. A state of charge determination system, comprising:
   battery voltage sensing logic configured to sense a voltage of a battery system;
   shunt voltage sensing logic configured to sense a charge flowing through the battery system; and
   a processor configured to:
      receive values corresponding to the sensed voltage and charge;
      analyze at least the sensed voltage and charge values over at least one defined duration period of time;
      determine anchoring points of charge integration that satisfy respective defined conditions for respective defined duration periods of time by a defined quantity of repetition of conditions based at least in part on the sensed voltage, time, and current, wherein the defined quantity of repetition is greater than 1;
      update a capacity of the battery system by assigning the determined anchoring points that satisfy the respective defined conditions as updated anchoring points of the charge integration thereby replacing values of previously assigned anchoring points; and
      determine a state of charge based on the updated anchoring points.

12. The system of claim 11, wherein the processor is further configured to update the capacity of the battery system by integrating the charge between two of the updated anchoring points.

13. The system of claim 12, wherein the processor is further configured to determine the state of charge by comparing an integrated charge change and the updated capacity.

14. The system of claim 11, wherein the processor is further configured to trigger the update during either a charging process or a discharging process corresponding to the battery system.

15. The system of claim 11, wherein the processor is further configured to trigger the update based on one or more of a defined period of time between anchoring points in which the charge integration occurs, a magnitude of current attained when at least one of the anchoring points is reached, or when one of the anchoring points is reached.

16. The system of claim 11, further comprising a display, wherein the processor is further configured to provide to the display:
   a certain displayed state of charge value if the charge integration comprises a charge count that exceeds a certain value corresponding to the state of charge before a high anchoring point is reached while continuing the charge integration; or
   another displayed state of charge based on a determined new reference point for the state of charge if the charge integration comprises a charge count that does not exceed the certain value and the high anchoring point is reached.

17. The system of claim 11, further comprising a display, wherein the processor is further configured to provide to the display:
   a low state of charge value if the charge integration decreases below a certain value before a low anchoring point is reached while continuing the charge integration; or
   the low state of charge value if the charge integration does not decrease below the certain value and the low anchoring point is reached, wherein the processor is further configured to continue the charge integration under new constraints.

* * * * *